(12) United States Patent
Cheng et al.

(10) Patent No.: US 9,026,874 B2
(45) Date of Patent: *May 5, 2015

(54) TEST ACCESS MECHANISM FOR DIAGNOSIS BASED ON PARTITIONING SCAN CHAINS

(71) Applicant: Mentor Graphics Corporation, Wilsonville, OR (US)

(72) Inventors: Wu-Tung Cheng, Lake Oswego, OR (US); Manish Sharma, Wilsonville, OR (US); Avijit Dutta, West Linn, OR (US); Robert Brady Benware, Clackamas, OR (US); Mark A. Kassab, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/100,774

(22) Filed: Dec. 9, 2013

(65) Prior Publication Data

US 2014/0101506 A1 Apr. 10, 2014

Related U.S. Application Data

(63) Continuation of application No. 13/091,092, filed on Apr. 20, 2011, now Pat. No. 8,607,107.

(60) Provisional application No. 61/326,097, filed on Apr. 20, 2010.

(51) Int. Cl.
*G01R 31/28* (2006.01)
*G01R 31/3177* (2006.01)
*G01R 31/3185* (2006.01)
*G06F 11/22* (2006.01)

(52) U.S. Cl.
CPC .... *G01R 31/3177* (2013.01); *G01R 31/318563* (2013.01); *G06F 11/2242* (2013.01)

(58) Field of Classification Search
CPC ............... G01R 31/318563; G06F 11/2242
See application file for complete search history.

(56) References Cited

U.S. PATENT DOCUMENTS

| | | | |
|---|---|---|---|
| 7,139,950 B2 | 11/2006 | Huisman et al. | |
| 7,313,744 B2 | 12/2007 | Huisman et al. | |
| 7,412,637 B2 | 8/2008 | Wang et al. | |

(Continued)

OTHER PUBLICATIONS

Chen et al., "Enabling Embedded Memory Diagnosis via Test Response Compression," *IEEE Proc. on VLSI Test Symp.*, pp. 292-298 (Apr. 2001).

(Continued)

*Primary Examiner* — Guerrier Merant
(74) *Attorney, Agent, or Firm* — Klarquist Sparkman, LLP

(57) ABSTRACT

Disclosed are representative embodiments of methods, apparatus, and systems for partitioning-based Test Access Mechanisms (TAM). Test response data are captured by scan cells of a plurality scan chains in a circuit under test and are compared with test response data expected for a good CUT to generate check values. Based on the check values, partition pass/fail signals are generated by partitioning scheme generators. Each of the partitioning scheme generators is configured to generate one of the partition pass/fail signals for one of partitioning schemes. A partitioning scheme divides the scan cells into a set of non-overlapping partitions. Based on the partition pass/fail signals, a failure diagnosis process may be performed.

24 Claims, 10 Drawing Sheets

(56) References Cited

U.S. PATENT DOCUMENTS

| | | |
|---|---|---|
| 7,729,884 B2 | 6/2010 | Huang et al. |
| 8,280,687 B2 | 10/2012 | Cheng et al. |
| 8,280,688 B2 | 10/2012 | Huang et al. |
| 8,607,107 B2 * | 12/2013 | Cheng et al. ............. 714/729 |
| 2002/0170009 A1 | 11/2002 | Barnhart |
| 2002/0184560 A1 | 12/2002 | Wang et al. |
| 2003/0200492 A1 | 10/2003 | Nakao et al. |
| 2004/0246337 A1 | 12/2004 | Hasegawa et al. |
| 2005/0193297 A1 | 9/2005 | Huisman et al. |
| 2006/0111873 A1 | 5/2006 | Huang et al. |
| 2007/0100586 A1 | 5/2007 | Cheng et al. |
| 2008/0215940 A1 | 9/2008 | Burlison et al. |
| 2008/0250284 A1 | 10/2008 | Guo et al. |
| 2010/0306606 A1 | 12/2010 | Huang et al. |
| 2011/0099442 A1 | 4/2011 | Hales et al. |
| 2011/0231719 A1 | 9/2011 | Kim et al. |
| 2011/0307750 A1 | 12/2011 | Narayanan et al. |

OTHER PUBLICATIONS

Chen et al., "Test Response Compression and Bitmap Encoding for Embedded Memories in Manufacturing Process Monitoring," *IEEE Int'l Test Conf.*, pp. 258-267 (Oct. 2001).

* cited by examiner

TEST ACCESS MECHANISM FOR DIAGNOSIS BASED ON PARTITIONING SCAN CHAINS

RELATED APPLICATIONS

This application is a continuation of U.S. patent application Ser. No. 13/091,092 entitled "Test Access Mechanism for Diagnosis Based on Partitioning Scan Chains," filed Apr. 20, 2011. which claims priority to U.S. Provisional Patent Application No. 61/326,097, entitled "A Novel Test Access Mechanism for Failure Diagnosis of Multiple Identical Cores," filed on Apr. 20, 2010, both of which are is incorporated entirely herein by reference.

FIELD OF THE INVENTION

The present invention relates to the field of testing integrated circuits. Various aspects of the invention may be particularly useful for failure diagnosis.

BACKGROUND OF THE INVENTION

In recent years the System-on-Chip (SoC) designs have evolved to include multiple cores to achieve several goals. This trend has been increasingly observed for graphics and gaming processors as well as conventional microprocessor designs. Multiple processor cores on a single chip provide performance benefits, additional multitasking capabilities, and dynamic repair opportunities which have the additional benefit of increased yield. They also present an opportunity to greatly reduce the test data volume and test time required to test the chip by using the embedded core testing methodology that completely isolates the cores via wrapper chains and then using a broadcast based Test Access Mechanism (TAM) to test all the cores in parallel. FIG. 1 illustrates an example SoC which has several identical cores, each having two internal chains. In this example, the test input stimuli (which is the same for each core since they are identical) can be fed into the chip using two chip level input pins 110 and then broadcast internally to all the cores.

On the output side, the test response from each core is expected to be the same if there is no defect since the cores are identical and isolated. The mask data indicating which channel and cycle should not be observed due to simulation unknowns and the expected test response data can be fed into the chip using chip level input pins 120 and 130, respectively. This data can then be internally broadcast to each core for masking (using the AND gates 160) and comparison (using the XOR gates 150) with CUT test response on chip. The comparison results from the same channel of each core can be logically ORed (using the OR gates 170) together to produce a pass/fail signal per core level channel brought out through two chip level output pins 140. These output pins 140 are observed during each shift cycle with a logic value "1" indicating a failure in a particular cycle and particular core level channel.

For this TAM, the number of chip level pins (and hence tester channels) is a constant that does not scale with the number of cores. Furthermore, the test data volume and test time are the same as that for a single core. Finally, since the test data is comprised of translated core level patterns, automatic test pattern generation (ATPG) need only be run at the core level.

While the test methodology illustrated in FIG. 1 is sufficient for pass/fail testing of chips, it presents a significant challenge for failure diagnosis. The shortcoming lies on the output side of the TAM. Observations on the output pins can be used to determine which cycle and which core level channel has a failure. It is, however, not possible to determine the failing core from this information. Furthermore since the cores are exercised with the exact same patterns, the same defect location will behave identically in every core. These two aspects together imply that diagnosis will not be able to distinguish between defects in different cores, thereby resulting in poor diagnosis resolution.

It would therefore be desirable to find TAM solutions that have one or more of the following properties: 1) the number of observation pins required does not scale with the number of cores and can practically be kept constant; 2) the hardware overhead is minimal; 3) the test-time overhead is also minimal with only a few additional shift cycles required at the end of the test session; 4) there is no addition to the test data volume; 5) the TAM is independent of core DFT architecture; and 6) the diagnostic resolution can easily be increased by adding more chip output pins if so desired.

BRIEF SUMMARY OF THE INVENTION

Disclosed are representative embodiments of methods, apparatus, and systems for partitioning-based Test Access Mechanisms (TAM). Scan cells of a plurality scan chains in a circuit under test are used to capture test response data. The test response data are compared with test response data expected for a good CUT to generate check values. The check values may be set as 0 for failing test responses and 1 for passing test responses, or vice versa. Based on the check values, partition pass/fail signals are generated by partitioning scheme generators. A failure diagnosis process then may be performed using the partition pass/fail signals. In some cases, scan cells capturing failing test responses (failing cells) may be identified. In some other cases, the scan cells may be categorized into three groups: scan cells capturing failing test responses (failing cells), scan cells capturing passing test responses (passing cells), and scan cells capturing either passing or failing test responses (unknown cells).

Each of the partitioning scheme generators is configured to generate one of the partition pass/fail signals for one of partitioning schemes. A partitioning scheme generator is a hardware structure that may comprise logic gates and, in some implementations of the invention, storing devices. A partitioning scheme divides the scan cells into a set of non-overlapping partitions. Each non-overlapping partition includes a set of scan cells from different scan chains. According to some embodiments of the invention, the partitioning schemes may be designed to satisfy a single overlap property, i.e. any two partitions chosen from two different partitioning schemes have at most one common scan cell between them. A simple example of a partitioning-based Test Access Mechanism comprises three partitioning scheme generators: one generator for a horizontal partitioning scheme and two generators for diagonal partitioning schemes.

A set of partitioning scheme generators may work with a subset of scan chains in a circuit under test. The reminder of the scan chains may be coupled through comparators to other partitioning scheme generators.

DETAILED DESCRIPTION OF THE INVENTION

General Considerations

Figure 1:
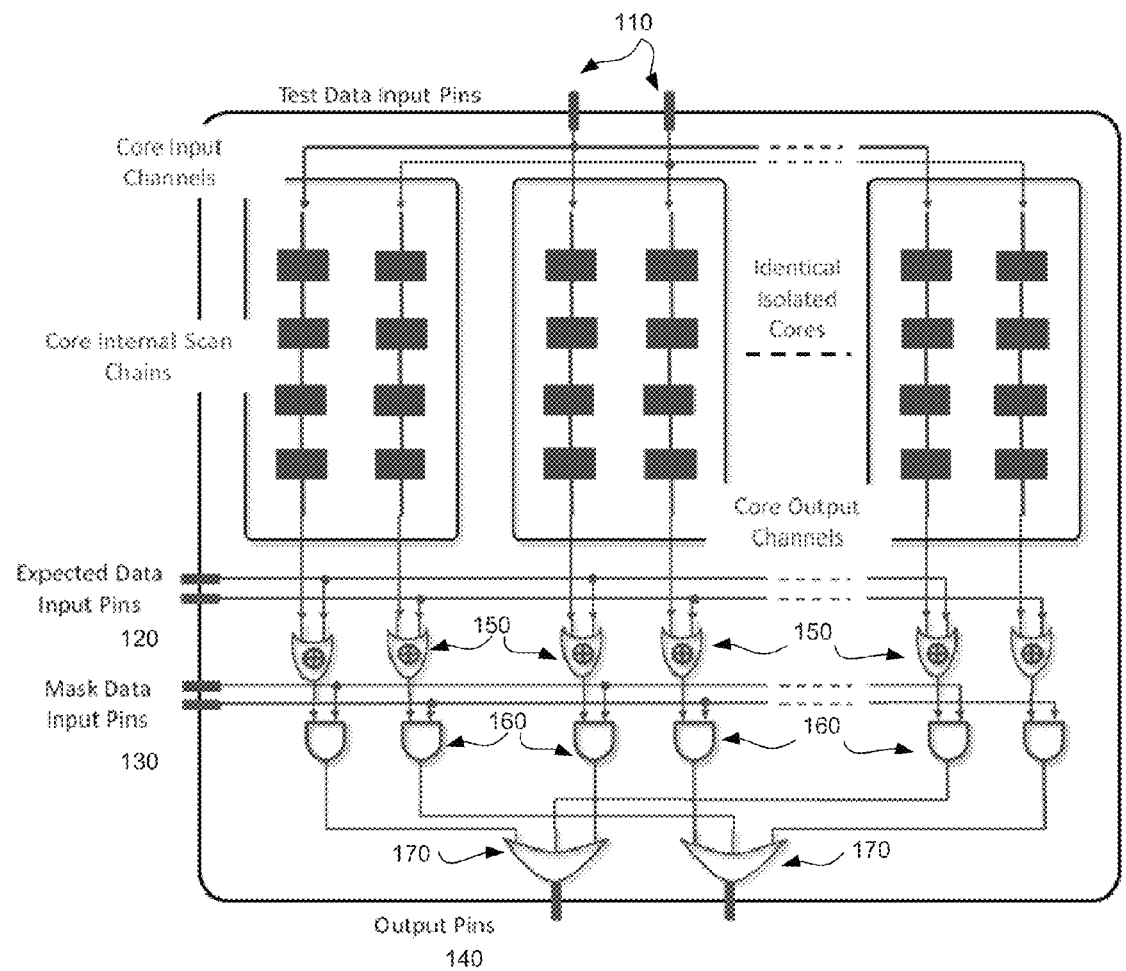
FIG. 1 illustrates an example of broadcast Test Access Mechanism for testing identical isolated cores.

Various aspects of the present invention relate to partitioning-based TAM for diagnosis. In the following description, numerous details are set forth for the purpose of explanation. However, one of ordinary skill in the art will realize that the invention may be practiced without the use of these specific details. In other instances, well-known features have not been described in detail to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "generate" and "determine" to describe the disclosed methods. These terms are high-level abstractions of the actual operations that are performed. The actual operations that correspond to these terms may vary depending on the particular implementation and are readily discernible by one of ordinary skill in the art. Further, the description sometimes also uses terms like "couple" and "connect" to describe the relationship between two circuit components/modules. These terms should include direct/indirect connections discernible by one of ordinary skill in the art.

Among the disclosed embodiments are test scheduling and test access techniques for SoC. This particular usage, however, should not be construed as limiting, as aspects of the disclosed technology can be used to implement test scheduling and test access techniques in other scan-based or partially-scan-based circuits (for example, systems-in-package (SiPs) application-specific integrated circuits (ASICs) (including mixed-signal ASICs), and programmable logic devices (PLDs), such as field programmable gate arrays (FPGAs)).

As more fully explained below, one or more portions of embodiments or whole embodiments of the disclosed technology can be performed or created by computer-executable instructions stored on one or more computer-readable media (e.g., tangible non-transitory computer-readable media such as one or more optical media discs, volatile memory or storage components (such as DRAM or SRAM), or nonvolatile memory or storage components (such as hard drives)) and executed on a computer. Such embodiments can be implemented, for example, as an electronic-design-automation (EDA) software tool (e.g., an automatic test pattern generation (ATPG) tool). The computer-executable instructions can be part of, for example, a dedicated software application or a software application that is accessed or downloaded via a web browser or other software application (such as a remote computing application). Such software can be executed, for example, on a single local computer or in a network environment (e.g., via the Internet, a wide-area network, a local-area network, a client-server network (such as a cloud computing network), or other such network) using one or more network computers. For clarity, only certain selected aspects of the software-based implementations are described. Other details that are well known in the art are omitted. For example, it should be understood that the disclosed technology is not limited to any specific computer language, software tool, or computer. Any of the disclosed methods can alternatively be implemented (partially or completely) in hardware (e.g., an ASIC, PLD, or SoC).

Additionally, any circuit description or design file describing any of the disclosed apparatus or any data structure, data file, intermediate result, or final result created or modified using any of the disclosed methods can be stored on one or more computer-readable storage medium (e.g., tangible non-transitory computer-readable media, such as one or more optical media discs, volatile memory or storage components (such as DRAM or SRAM), or nonvolatile memory or storage components (such as hard drives)).

Furthermore, any of the software-based embodiments (comprising, for example, computer-executable instructions which when executed by a computer cause the computer to perform any of the disclosed methods or to create design data for any of the disclosed apparatus) can be transmitted, received, or accessed through a suitable communication means. For example, a server computer can transmit to a client computer the computer-executable instructions for performing any of the disclosed methods or for creating design data for any of the disclosed apparatus (e.g., after the server receives a request from the client computer to download the computer-exectuable instructions). Similarly, any circuit description, design file, data structure, data file, intermediate result, or final result created or modified using any of the disclosed methods or describing any of the disclosed apparatus can be transmitted, received, or accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means. Such communication means can be, for example, part of a shared or private network.

Additionally, any circuit description, design file, data structure, data file, intermediate result, or final result produced by any of the disclosed methods or describing any of the disclosed apparatus can be displayed to a user using a suitable display device (e.g., a computer monitor, touch screen, or other such display device). Such displaying can be performed as part of a computer-implemented method of performing any of the disclosed methods.

The disclosed methods or apparatus can be used or implemented at one or more stages of an overall design flow. Circuits manufactured using designs created or tested using embodiments of the disclosed technology are also considered to be within the scope of this disclosure. For example, a circuit design describing any of the disclosed testing environments can be fabricated into an integrated circuit using known microlithography techniques.

Any of the disclosed methods or apparatus can be performed or designed in an EDA environment. For presentation purposes, however, the present disclosure sometimes refers to a circuit-under-test (including the various components of the circuit-under-test) and the associated testing hardware (including the various components of the hardware) by their physical counterparts (for example, scan chains, scan cells, output integrator, test access network, and other such terms). It should be understood, however, that any such reference not only includes the physical components but also includes representations of such components stored on non-transitory computer-readable media as are used in simulation, automatic test pattern generation, or other such EDA environments. For example, any of the disclosed apparatus can be described or represented as design data or design information stored on one or more computer-readable media. More specifically, any of the disclosed testing apparatus can be described or represented in an HDL file (such as a Verilog, VHDL, or register-transfer level file), a gate-level netlist, or other such EDA design file (e.g., a GDSII file or Oasis file). Such design data or design information can be created using an appropriate EDA software tool.

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

Partitioning-Based TAM

To discuss the partitioning-based TAM, several relevant terms are introduced first. The term "check value" is defined as a binary value to indicate a passing test response, (i.e. the test response captured is same as the excepted response in a normal defect free case) and a failing test response (i.e. the test response captured is different from the excepted response in a normal defect free case). In the following discussion, a check value of 0 is referred to as the passing value and a check value of 1 as the failing value. It should be appreciated by a person having ordinary skills in the art that the check value can also use a 1 for a passing response and a 0 for a failing response instead. Then a check value of 1 is referred to as the passing value and a check value of 0 as the failing value.

Figure 2:
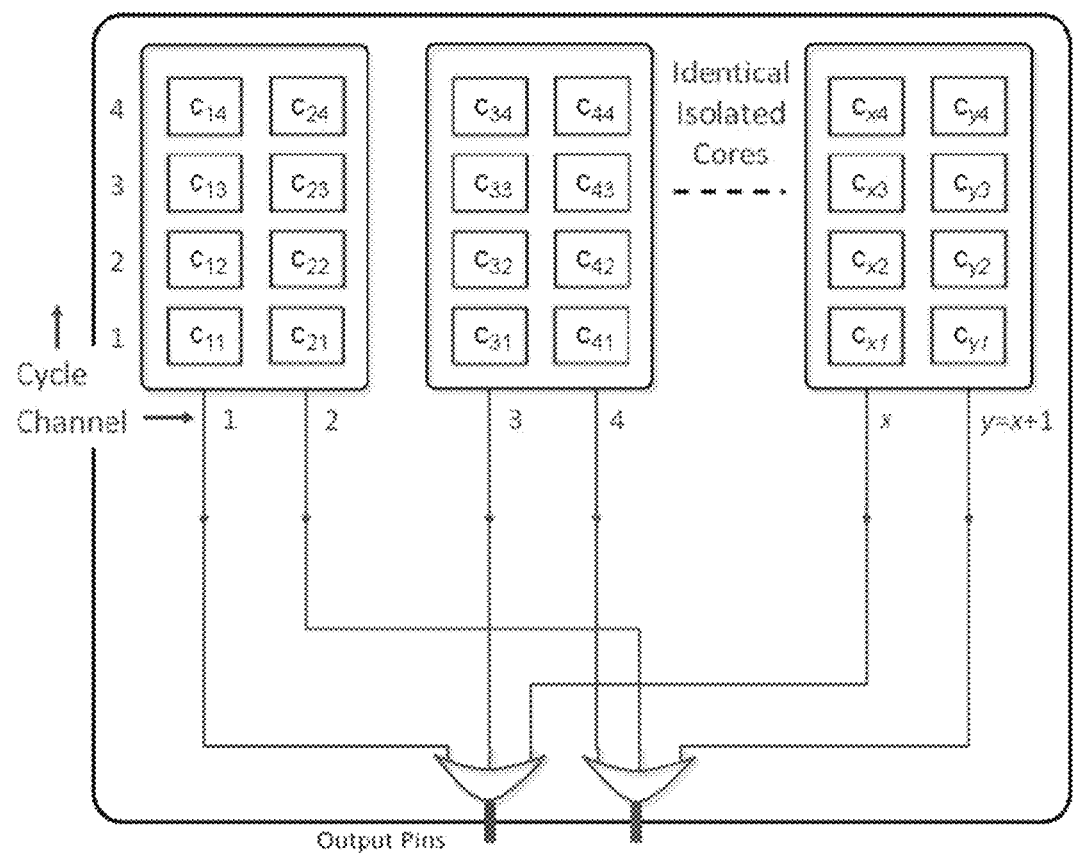
FIG. 2 illustrates an abstract view of the circuit under test shown in FIG. 1 that replaces scan cells with check cells.

The CUT shown in FIG. 1 can be abstracted by removing the comparator logic 150 and the masking logic 160, and by assuming the scan cells now contain check values $c_{ij}$ (referred to as check cells). The circuit after the abstraction is shown in FIG. 2. A check cell that has a passing value is referred to as passing cell and a check cell that has a failing value is termed as failing cell. It should be noted that the introduction of "check cells" is for simplifying description and understanding of the partitioning-based TAM.

With various implementations of the invention, the scan cells (or the check cells) are divided into a set of non-overlapping partitions. Thus, each non-overlapping partition is a group of scan cells. Each scan cell in a non-overlapping partition is selected from a different scan chain. The term non-overlapping means that no partitions in the set of non-overlapping partitions share a common scan cell.

Such a set of non-overlapping partitions is called a partitioning scheme. With various implementations of the invention, a partitioning scheme generator is used to generate a partition pass/fail signal for a partitioning scheme. The partition pass/fail signal includes pass/fail information for each partition in the partitioning scheme separated in time. The partitioning scheme generator is a hardware structure that may comprise logic gates and, in some implementations, storing devices. According to various embodiments of the invention, a partitioning scheme generator has multiple inputs that are coupled to the scan chains (not directly but through comparators associated with the scan chains) and a single output connected to a chip output pin.

Figure 3:
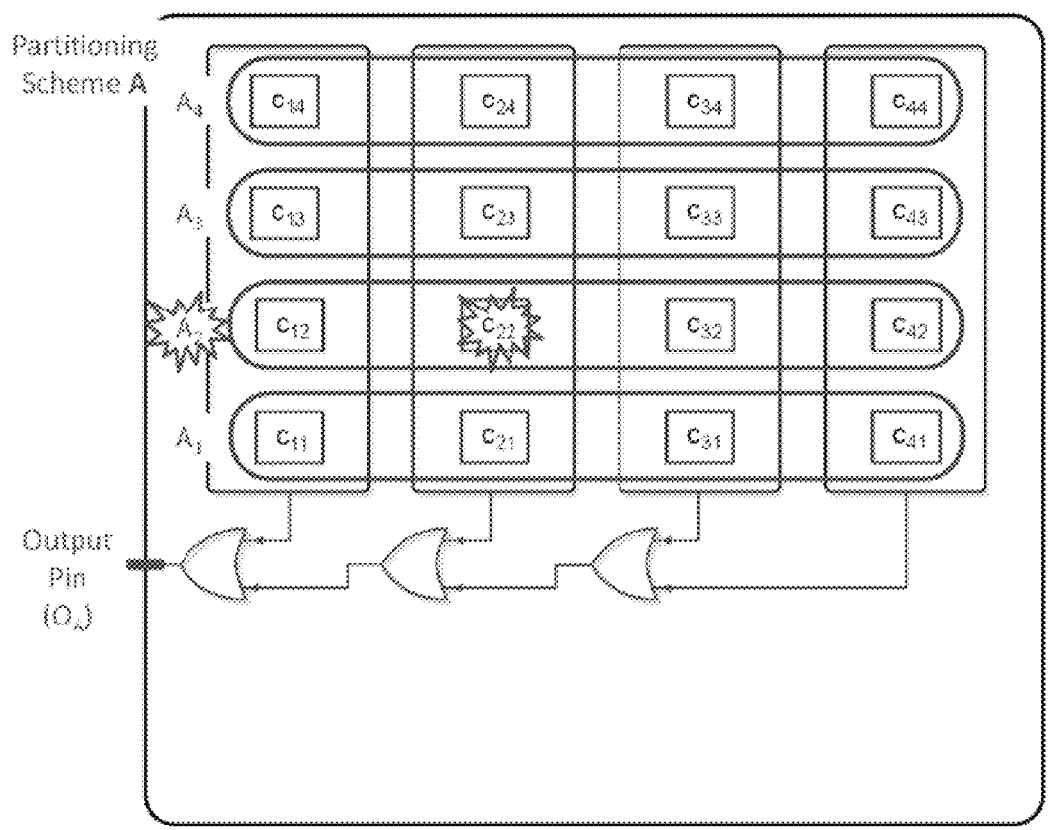
FIG. 3 illustrates a horizontal partitioning scheme for a circuit under test with four identical cores.

FIG. 3 illustrates an example of a partitioning scheme generator. In this example, the CUT contains four identical isolated cores with a single channel per core. Four shift clock cycles (or unload cycles) are needed to unload test response data for each pattern. As in FIG. 2, the CUT has an abstract view in which comparators are removed and scan cells are replaced with corresponding check cells. The partitioning scheme generator comprises three OR gates connected in series. One of the two input pins for each OR gate are coupled to a particular scan chain. This structure leads to a partitioning scheme A that divides the check cells into four horizontal partitions as indicated in FIG. 3 ($A_1$, $A_2$, $A_3$ and $A_4$). The output signal at the output pin OA in each unload cycle provides a single bit pass/fail status of a partition from scheme A. For example, in the first unload cycle, the pass/fail status of $A_1$ is observed, and in the second unload cycle, the pass/fail status of $A_2$ is observed.

Assuming a partitioning scheme where logical "0" is a passing value and logical "1" is a failing value, when a 0 is observed on OA in a particular unload cycle, it implies that all the scan cells in the corresponding partition captured passing test responses. On the other hand, if a 1 is observed, it implies that one or more of the scan cells captured failing test responses. However, from a single bit pass/fail status, the failing scan cells within the partition cannot be determined. As an example, it is assumed that chips of the design shown in FIG. 3 are being tested and that, for a particular defective chip, a failure is captured in cell $c_{22}$. In this case, a 1 is observed on the pin OA in the second unload cycle (assuming primary outputs are measured before applying the shift clock in an unload cycle). This indicates that partition $A_2$ is failing, or four check cells, $c_{12}$, $c_{22}$, $c_{32}$ and $c_{42}$, are candidate failing cells). However, it is not possible to tell which of the four check cells are failing cells.

Figure 4:
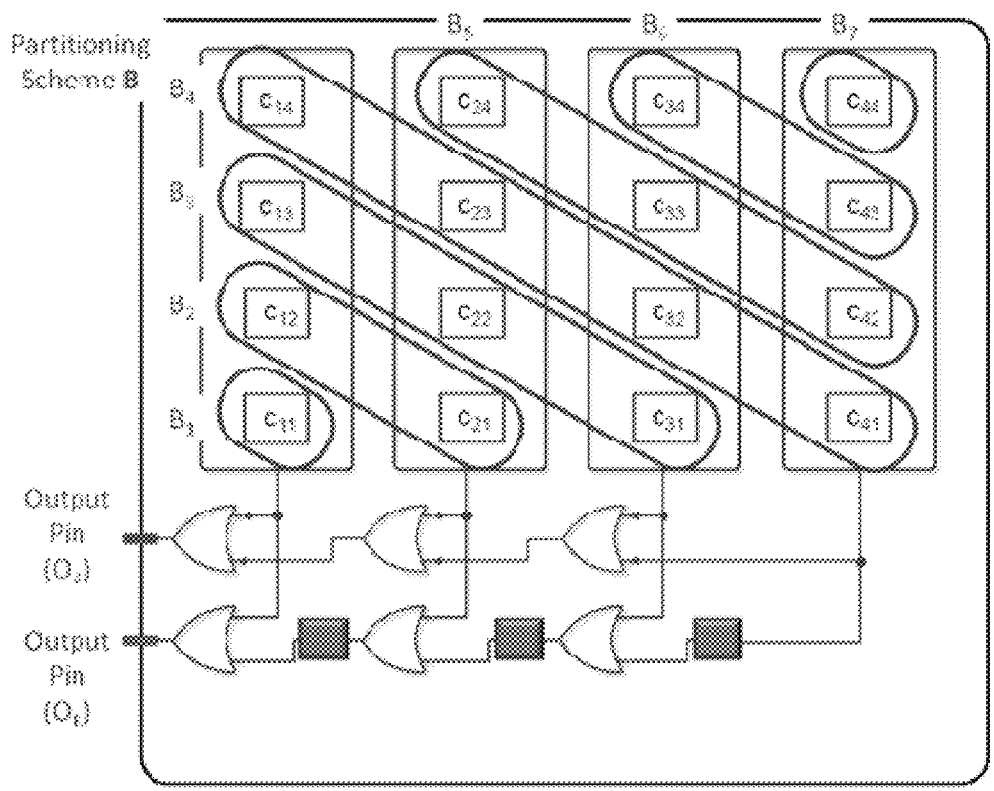
FIG. 4 illustrates a first diagonal partitioning scheme for the circuit under test shown in FIG. 3.

More partitioning schemes may be used to reduce the number of candidate failing cells. FIG. 4 illustrates another partitioning scheme, named B, comprising of diagonal partitions for the same CUT shown in FIG. 3. Here, the partitioning scheme generator comprises three OR gates along with three flip-flops represented by squares. The flip-flops use the same clock as used for shifting the scan chains and thus are frozen during capture. The pass/fail status of the partitions in this scheme is produced at the new output pin labeled OB. This hardware structure produces a diagonal partitioning scheme including diagonal partitions $B_1$-$B_7$. These diagonal partitions can be unloaded consecutively using seven shift clock cycles.

Figure 5:
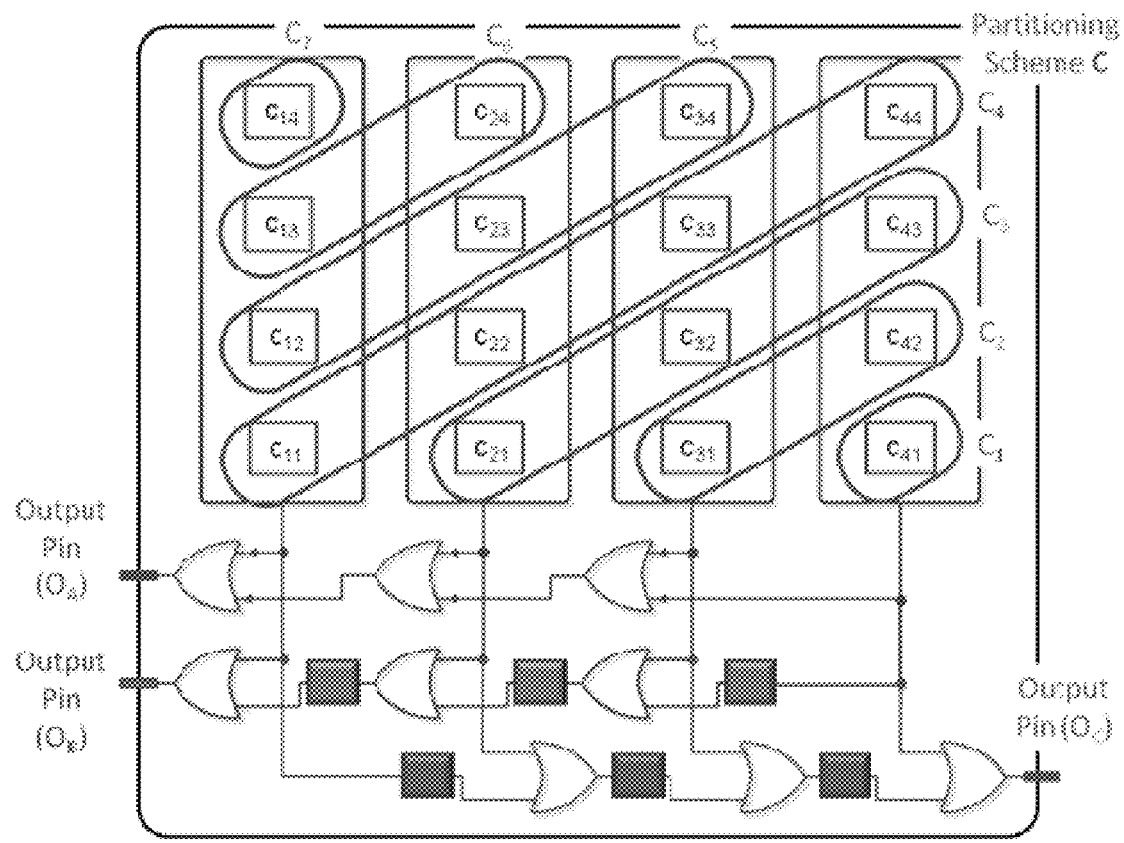
FIG. 5 illustrates a second diagonal partitioning scheme for the circuit under test shown in FIG. 3.

Similarly, a third partitioning scheme named C can be added to the system as illustrated in FIG. 5. The scheme C comprises diagonal partitions crossing those in scheme B. The partitioning scheme generator has a similar hardware structure as the one for scheme B. They are mirror images of each other. A new output pin called OC is added to observe the pass/fail status of partitions from scheme C.

Figure 6:
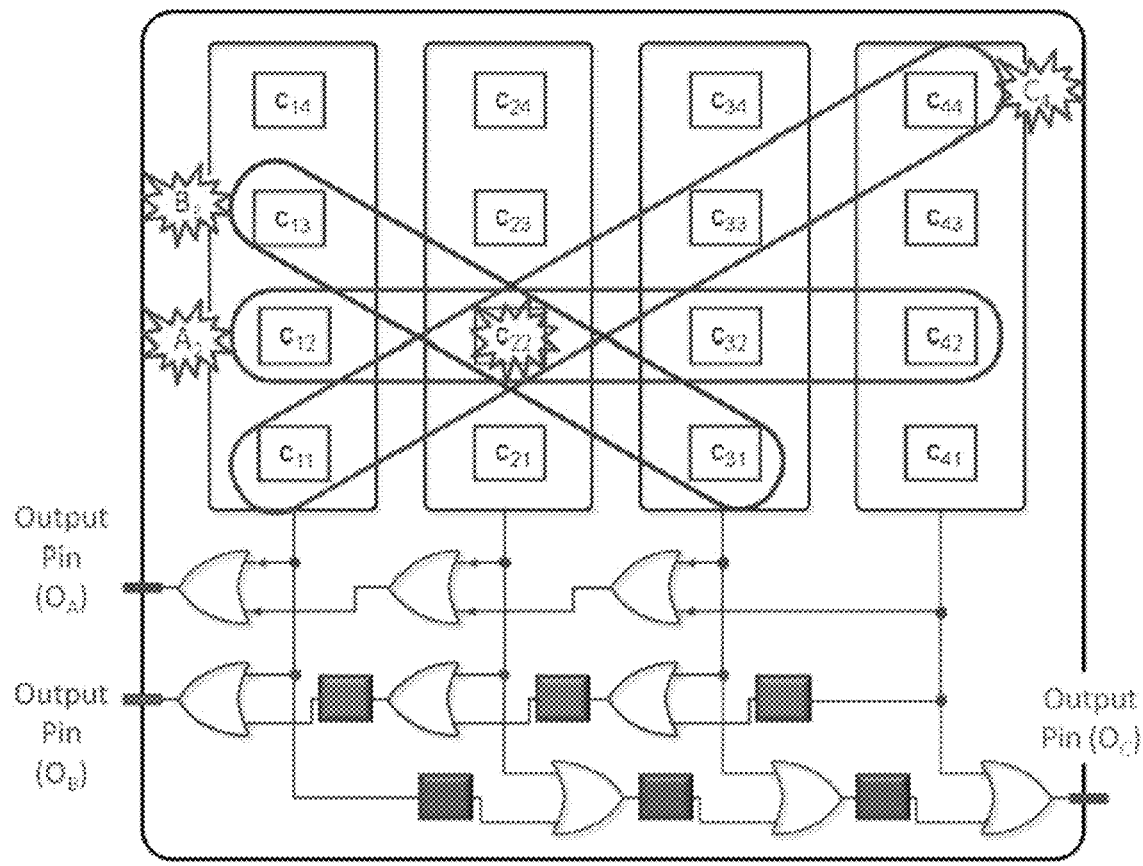
FIG. 6 illustrates the localization of a single failing cell using three partitioning schemes.

With the three partitioning schemes A, B and C, the diagnosis resolution for a defect scenario shown in FIG. 3 is improved. Now in addition to knowing that partition $A_2$ in scheme A is failing, the partition $B_3$ in scheme B and partition $C_4$ in scheme C are also known to be failing (from a value 1 observed during the third unload cycle on pin OB and the fourth unload cycle on pin OC). This situation is shown in FIG. 6. Based on the additional information, the failing cell can now be precisely pin-pointed to $c_{22}$. This inference can be drawn through the following reasoning: since $A_1$, $A_3$ and $A_4$ are passing partitions all the check cells contained in them must be passing. This leaves $c_{12}$, $c_{22}$, $c_{32}$ and $c_{42}$ as the check cells that are possibly failing. Out of these, $c_{12}$, $c_{32}$ and $c_{42}$ are passing cells since they are contained in $C_5$, $C_3$ and $C_2$, respectively, and these are all passing partitions. Note that the same conclusion could also be reached using the passing partitions in B. Now only $c_{22}$ is identified to be a failing cell. Furthermore, the cell $c_{22}$ is contained in all three failing partitions: $A_2$, $B_3$ and $C_4$, thereby explaining the observed behavior. While three partitioning schemes may be redundant if only one falling cell is known to exist, they may be needed to achieve a good diagnosis resolution in many other cases.

Figure 7:
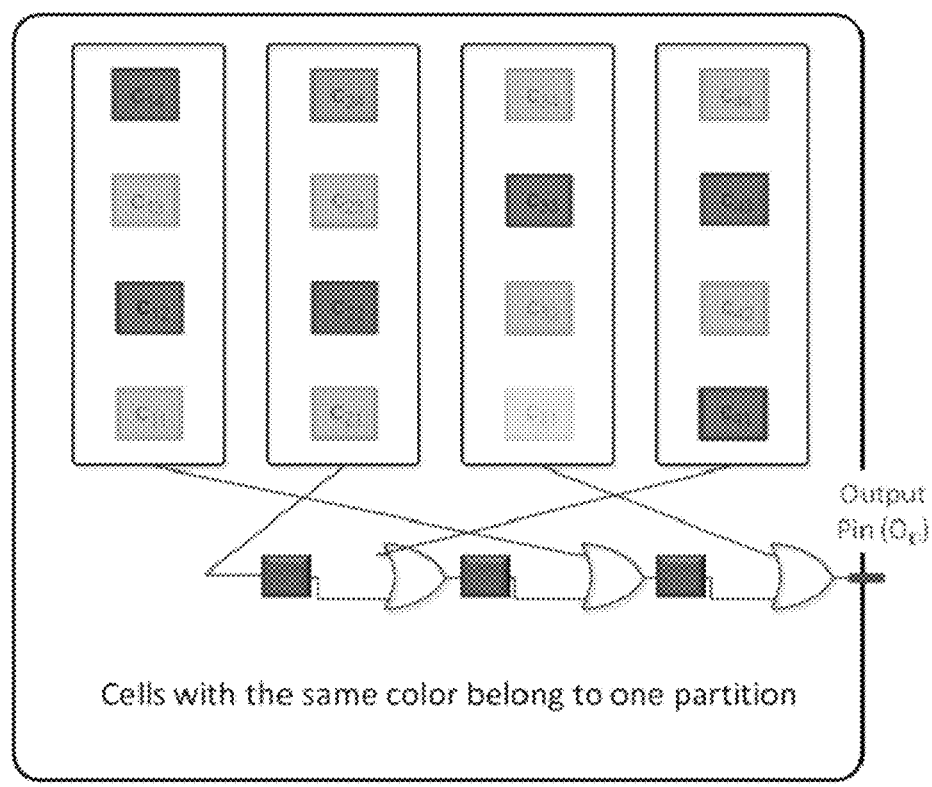
FIG. 7 illustrates a fourth partitioning scheme for the circuit under test shown in FIG. 3.

More partitioning schemes can be added to further improve the diagnosis resolution. One simple way to add more partitioning schemes is switching the connections from scan chains (the comparators associated with the scan chains) to the inputs of a partitioning scheme generator. An example is illustrated in FIG. 7. This is a fourth partitioning scheme D for the same CUT shown in FIGS. 3-6. Check cells in different partitions are as shown using different colors (shades). For example, $c_{33}$, $c_{12}$ and $c_{41}$ belong to one partition.

Partitioning schemes are said to satisfy a single overlap property if any two partitions chosen from two different partitioning schemes have at most one common check cell between them. The four partitioning schemes A, B, C and D satisfy the single overlap property. In FIG. 6, the highlighted three partitions from schemes A, B and C have only one common check cell. It has been shown that if there are n partitioning schemes that satisfy the single overlap property, and the number of failing cells is less than n then they can be precisely identified. Accordingly, if there are at most n-1 failing cells, n partitioning schemes are enough to distinctively identify them. It should be noted that the diagnosis resolution requirement is only one of many factors for choosing the number of partitioning schemes. Other factors include the number chip output pins and the hardware overhead.

Switching the connections from scan chains (the comparators associated with the scan chains) to the inputs of a partitioning scheme generator may not yield a scheme that satisfies the single overlap property. Nonetheless, even with these applications, every additional scheme may help better localize failing cells, hence leading to better diagnosis.

In some embodiments of the invention, a plurality of partitioning scheme generators may be coupled to only a subset of scan chains in a CUT.

Figure 8:
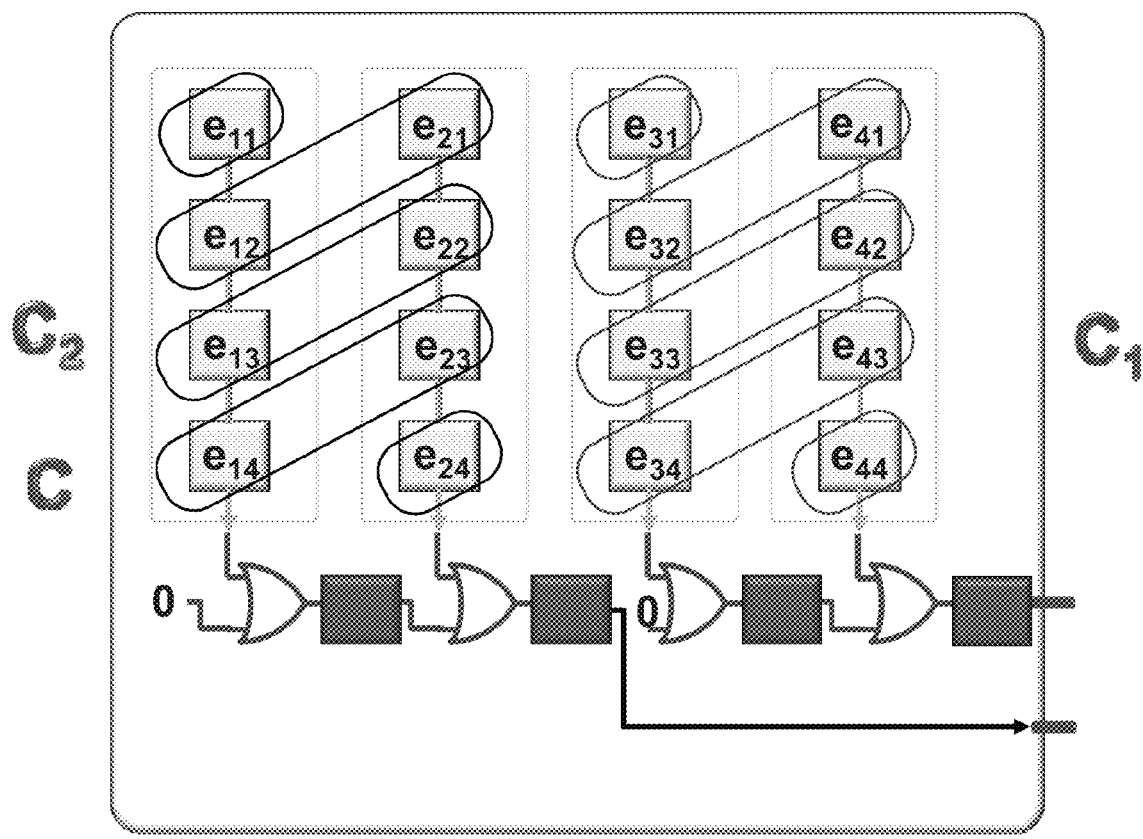
FIG. 8 illustrates an example in which scan chains are divided into two scan chain groups and each scan chain group has its own set of partitioning scheme generators.

For example, scan chains may first be divided into a plurality of scan chain groups. For each scan chain group, a plurality of partitioning scheme generators may be used. FIG. 8 illustrates a simple example. The four scan chains are divided into two scan chain groups. For simplicity, only one partitioning scheme generator is shown for each scan chain group.

Diagnosis Using Partition Pass/Fail Information

In various embodiments of the invention, the partition pass/fail signals generated by a plurality of partitioning scheme generators can be used to separate check cells into two or three groups according to the rules.

First, any check cell that is contained in a passing partition must be a passing cell.

Second, of the remaining cells, if a cell that is contained in some failing partition and all other cells in that partition have already been identified as passing before, this cell must be a failing cell.

Third, all the cells that remain after the two previous steps are unknown cells.

Figure 9:
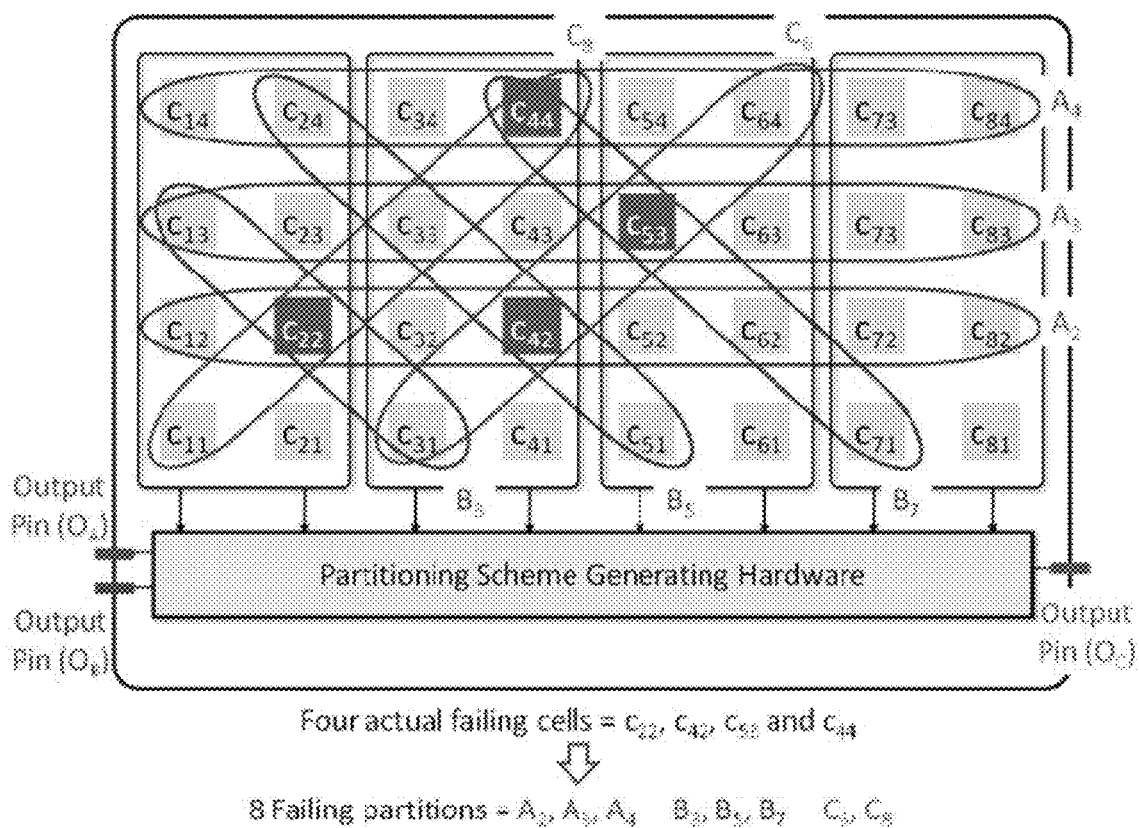
FIG. 9 illustrates an application of the diagnosis rules.

FIG. 9 uses a hypothetical circuit to illustrate the application of the above rules. This hypothetical circuit has four identical and isolated cores with two channels (scan chains) each and each scan chain has four scan cells. There are three partitioning schemes A, B and C, with one output pin for each scheme. Note that this is different from the configuration shown in the example of FIG. 1. Instead of one output pin per core level channel, that example has one pin for all channels per scheme. Consider a defect scenario in which, for some failing pattern, the actual failing cells are $c_{22}$, $c_{42}$, $c_{53}$ and $c_{44}$ as shown in FIG. 9. Hence, a partition that includes any of these failing cells will be a failing partition. There are eight such partitions: $A_2$, $A_3$ and $A_4$ from scheme A, $B_3$, $B_5$ and $B_7$ from scheme B and $C_6$ and $C_8$ from C. This failing partition list is the only information that will be known while testing this chip on an automated test equipment (ATE) and it will form the basis for diagnosis.

Using the first rule, all cells except $c_{22}$, $c_{42}$, $c_{53}$, $c_{44}$ and $c_{33}$ are identified as passing cells. Next, $c_{22}$ is identified as a failing cell using the second rule since it is the only non-passing cell in partition $B_3$ and $B_3$ is a failing partition. Similarly $c_{44}$ is identified as a failing cell. Finally, the remaining three cells $c_{42}$, $c_{53}$ and $c_{33}$ are unknown cells.

In general, effective core level diagnosis can be performed as long as a substantial percentage of failing cells are identified, and, there are a relatively small number of unknown cells. In such a case, core level diagnosis can proceed by masking the unknown cells and only using the passing and failing cells. Furthermore, a technique called direct diagnosis can be used to exploit the relationships imposed by partitioning schemes among unknown cells to further improve diagnosis quality. In FIG. 9, for example, the unknown cells $c_{33}$ and $c_{53}$ occur together in failing partition $A_3$. This implies $c_{33}+c_{53}=1$. Similarly, $c_{42}+c_{33}=1$ and $c_{42}+c_{53}=1$. Based on these relations it can be inferred that at least two of the three unknown cells must be failing. Therefore any suspect location found during the further diagnosis process that does not explain at least two of the unknown cells can be discarded, further improving diagnostic resolution.

Once core level failure information is determined using the above process, the core level diagnosis can be done independently which implies core level Design For Test (DFT) architectures may be supported including each core having its own modular compression scheme.

Avoiding Extra Unload Cycles Per Pattern

Figure 10:
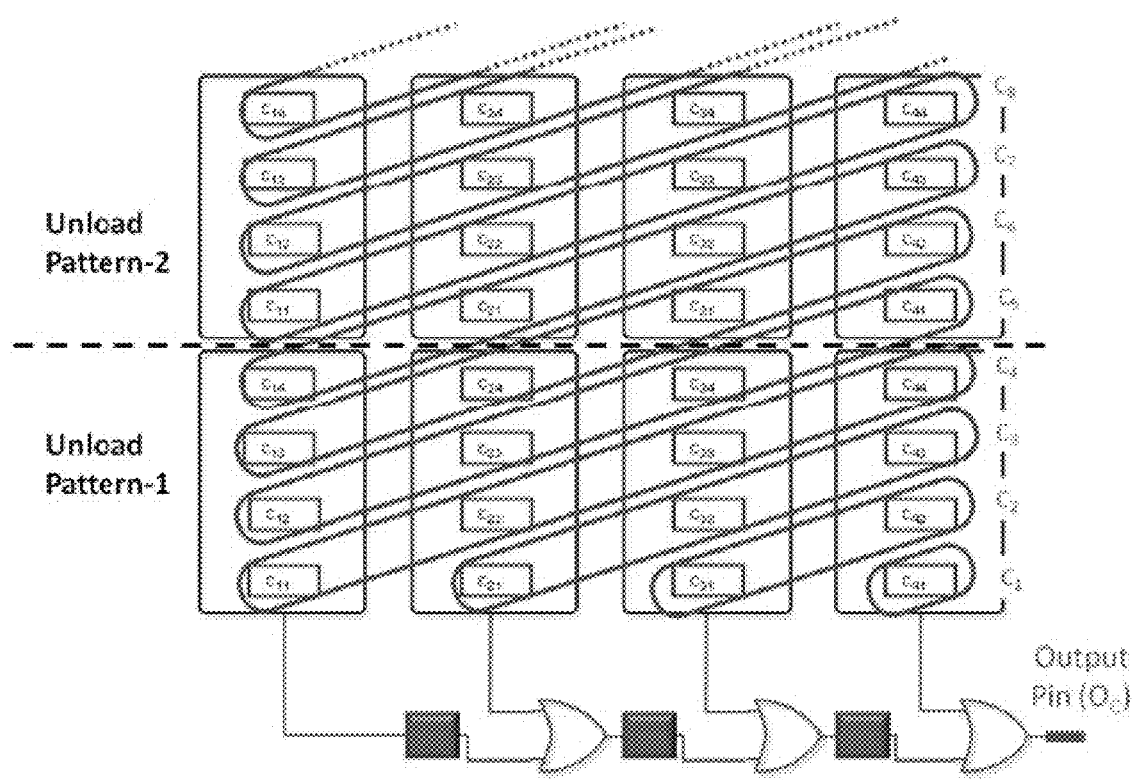
FIG. 10 illustrates an example of reducing unload cycles per pattern by allowing partitions to cross pattern boundary.

The partitioning based TAM according to various embodiments of the invention may appear to require more unload cycles per pattern than the maximum chain length. For example, in the design shown in FIG. 5, the number of cycles required to unload the scan chains for a single patterns is four. However, there are 7 partitions in schemes B and C. This would mean that seven unload cycles are required per pattern since we observe the pass/fail status of one partition per unload cycle. This may be an unacceptable overhead. So, while the illustration in FIG. 5 is suitable for explaining the concept of partitioning, the partitioning scheme generators may work a bit differently by allowing the partitions to cross test pattern boundaries. In other words the flip-flops in the partitioning scheme generators in FIG. 5 need not be flushed out completely and reset at the end of every test pattern. The flip-flops may be reset to all zeros in the beginning of a test set and then let the partitioning scheme generators run freely over all test patterns in the set. This adds some extra unload cycles after the last pattern to let the partitioning scheme generators finish partition generation. With this modification, the C partitions in the example design of FIG. 5 will look like as shown in FIG. 10. This figure shows the unload cycles of two consecutive test patterns (named 1 and 2) unrolled in time. As can be seen, some partitions (e.g. $C_5$ and $C_6$) now cross pattern boundaries. Since the partitioning scheme generators continuously generate pass/fail signals, the number of unload cycles for a pattern does not increase. The overhead will be p-1 additional unload cycles (where p is the number of flops in the partitioning scheme generators) at the very end of test set which is very marginal compared to the total unload cycles over all the patterns.

Note that only the diagonal partitions in schemes B and C cross pattern boundaries. The horizontal partitions in A do not cross pattern boundaries. This implies that failing patterns are still exactly known. The impact on diagnosis of letting partitions cross pattern boundaries is limited because the skewed OR output hardware structure does not have feedback. Therefore, a failing cell interacts with another failing cell that is at most p cycles apart.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while only circuit designs with identical isolated cores are used in the examples, the invention can be applied to various other circuit designs. Further, in all of the examples, the check value uses 0 for a passing test response and 1 for the failing test response. As already discussed, the alternative setting can be applied as well. The structure of partitioning scheme generators need to be modified accordingly. One approach is to replace each OR gate in a partitioning scheme generator with an AND gate.

What is claimed is:

1. A memory or storage device storing instructions, which when executed by a processing unit, cause a method for testing a circuit to be performed, the method comprising:
    capturing test response data of a circuit under test in scan cells, the scan cells forming a plurality of scan chains;
    generating check values for the test response data based on expected test response data while the test response data are being shifted out from the plurality of scan chains; and
    generating partition pass/fail signals based on the check values using a plurality of partitioning scheme generators while the checked values are being generated, each of the plurality of partitioning scheme generators configured to generate one of the partition pass/fail signals for one of a plurality of partitioning schemes, each of the partitioning schemes dividing the scan cells into a set of non-overlapping partitions, each non-overlapping partition in the set of non-overlapping partitions including a set of scan cells from different scan chains.

2. The memory or storage device of claim 1, wherein the plurality of scan chains are a subset of scan chains in the circuit under test and the test response data are a portion of total test response data of the circuit under test.

3. The memory or storage device of claim 1, wherein the partitioning schemes satisfy a single overlap property.

4. The memory or storage device of claim 1, wherein the test response data are generated by applying a series of test patterns to the circuit under test.

5. The memory or storage device of claim 1, wherein the circuit under test comprises a plurality of cores.

6. The memory or storage device of claim 5, wherein the plurality of cores are identical cores.

7. The memory or storage device of claim 1, wherein the method further comprises:
    determining passing cells based on the partition pass/fail signals.

8. The memory or storage device of claim 7, wherein the method further comprises:
    determining failing cells based on the partition pass/fail signals and the passing cells.

9. The memory or storage device of claim 8, wherein the method further comprises:
    determining unknown cells based on the partition pass/fail signals, the passing cells and the failing cells.

10. The memory or storage device of claim 9, wherein the method further comprises:
    performing a further diagnosis process based on information related to the unknown cells, the passing cells and the failing cells.

11. The memory or storage device of claim 10, wherein the information related to the unknown cells, the passing cells and the failing cells comprises relationships imposed by the partitioning schemes among the unknown cells.

12. The memory or storage device of claim 1, wherein the partitioning schemes comprise three partitioning schemes, one of the three partitioning schemes being a horizontal partitioning scheme.

13. The memory or storage device of claim 12, wherein the other two of the three partitioning schemes are two diagonal partitioning schemes.

14. The memory or storage device of claim 1, wherein the check values use 1 to indicate a failing test response and the plurality of partitioning scheme generators comprises OR gates or OR gates coupled with storing devices.

15. The memory or storage device of claim 1, wherein the check values use 0 to indicate a failing test response and the plurality of partitioning scheme generators comprises AND gates or AND gates coupled with storing devices.

16. A memory or storage device storing circuit design information for a circuit for testing, the circuit comprising:
    comparator circuitry configured to generate check values for test response data of a circuit under test based on expected test response data, the test response data being captured in scan cells, the scan cells forming a plurality of scan chains; and
    a plurality of partitioning scheme generators configured to generate partition pass/fail signals, each of the plurality of partitioning scheme generators configured to generate one of the partition pass/fail signals for one of a plurality of partitioning schemes based on the check values, each of the partitioning schemes dividing the scan cells into a set of non-overlapping partitions, each non-overlapping partition in the set of non-overlapping partitions including a set of scan cells from different scan chains.

17. The memory or storage device of in claim 16, wherein the plurality of scan chains are a subset of scan chains in the circuit under test and the test response data are a portion of total test response data of the circuit under test.

18. The memory or storage device of claim 16, wherein the partitioning schemes satisfy a single overlap property.

19. The memory or storage device of claim 16, wherein the circuit under test comprises a plurality of cores.

20. The memory or storage device of claim 19, wherein the plurality of cores are identical cores.

21. The memory or storage device of claim 16, wherein the partitioning schemes comprise three partitioning schemes, one of the three partitioning schemes being a horizontal partitioning scheme.

22. The memory or storage device of claim 21, wherein the other two of the three partitioning schemes are two diagonal partitioning schemes.

23. The memory or storage device of claim 16, wherein the check values use 1 to indicate a failing test response and the plurality of partitioning scheme generators comprises OR gates or OR gates coupled with storing devices.

24. The memory or storage device of claim 16, wherein the check values use 0 to indicate a failing test response and the plurality of partitioning scheme generators comprises AND gates or AND gates coupled with storing devices.

* * * * *